United States Patent
Lim et al.

(10) Patent No.: US 7,248,975 B2
(45) Date of Patent: Jul. 24, 2007

(54) REAL TIME MONITORING OF PARTICULATE CONTAMINATION IN A WAFER PROCESSING CHAMBER

(75) Inventors: Khoon Peng Lim, Singapore (SG); Lai Seng Foo, Singapore (SG)

(73) Assignee: TECH Semiconductor Singapore Pte Ltd, Singapore (SG)

( * ) Notice: Subject to any disclaimer, the term of this patent is extended or adjusted under 35 U.S.C. 154(b) by 0 days.

(21) Appl. No.: 11/230,386

(22) Filed: Sep. 20, 2005

(65) Prior Publication Data
US 2007/0067117 A1    Mar. 22, 2007

(51) Int. Cl.
*G06F 19/00* (2006.01)

(52) U.S. Cl. .................. 702/56; 702/57; 702/183; 702/184; 702/185; 702/186; 702/187; 702/188; 702/189; 702/190; 702/191; 702/192; 702/193; 702/197

(58) Field of Classification Search .................. 702/56, 702/57, 183–193, 197; 73/593, 514.01
See application file for complete search history.

(56) References Cited

U.S. PATENT DOCUMENTS

| | | | |
|---|---|---|---|
| 5,271,264 A | 12/1993 | Chanayem | 73/28.01 |
| 5,347,138 A | 9/1994 | Aqui et al. | 250/573 |
| 5,481,357 A | 1/1996 | Ahsan et al. | 356/338 |
| 5,814,733 A | 9/1998 | Khoury et al. | 73/658 |
| 5,943,130 A | 8/1999 | Bonin et al. | 356/336 |
| 5,963,315 A | 10/1999 | Hiatt et al. | 356/237.3 |
| 6,032,544 A | 3/2000 | Harwell et al. | 73/865.5 |
| 6,115,120 A | 9/2000 | Moriya et al. | 356/337 |
| 6,195,621 B1 * | 2/2001 | Bottomfield | 702/183 |
| 2002/0108444 A1 * | 8/2002 | Matsuoka | 73/593 |
| 2004/0173310 A1 | 9/2004 | Baier | 156/345.2 |
| 2005/0160814 A1 * | 7/2005 | Vaganov et al. | 73/514.01 |

* cited by examiner

*Primary Examiner*—Hal Wachsman
*Assistant Examiner*—Phuong Huynh
(74) *Attorney, Agent, or Firm*—Saile Ackerman LLC; Stephen B. Ackerman (57) ABSTRACT

An apparatus and method for use is described which permits real time monitoring of build-up of particulate contamination in a wafer processing chamber. The apparatus is capable of monitoring particle build up in regions of a processing chamber which are not accessible by traditional optical particle scanners. An accelerometer is fastened to a body in the chamber upon which particulates deposit. The body is subjected to vibrations and produces a vibration signal which is detected by the accelerometer. The signal is processed to form a frequency spectrum of vibration amplitudes. Frequencies in a selected band are directly proportional to the particulate build up on the body. The invention is applied to a wafer annealing tool with a rotatable platform wherein particles deposit on a support body under the wafer. The method and apparatus have been shown to be reliable and accurate as well as cost effective and easily implemented.

16 Claims, 5 Drawing Sheets

REAL TIME MONITORING OF PARTICULATE CONTAMINATION IN A WAFER PROCESSING CHAMBER

BACKGROUND OF THE INVENTION (1) Field of the Invention

The invention relates to processes for the manufacture of semiconductor devices and more particularly to a method and apparatus for measuring particulate contamination in an enclosed chamber during wafer processing.

(2) Background of the Invention and Description of Previous Art

Figure 1:
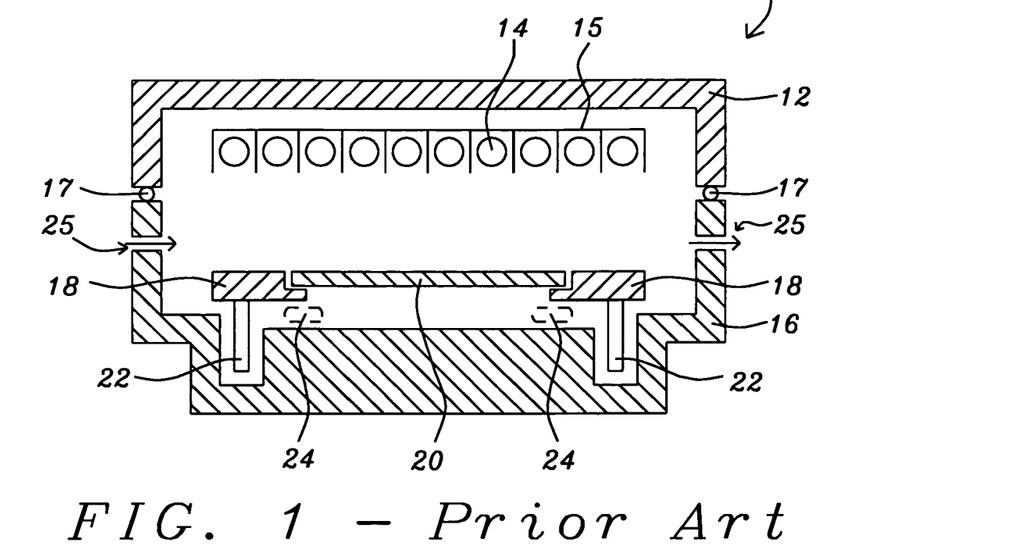
FIG. 1 is a cross section showing the construction of a typical processing chamber used for annealing semiconductor wafers.

A conventional way of detecting particle contamination in a wafer processing chamber is by using an in-situ particle monitor (ISPM) installed in the exhaust line of the chamber. The working principle of most ISPM involves counting the number of particles that pass through a light or laser beam. Such a method is not effective if there is 'blind spot' in the chamber which prevents efficient flow of purge gas to the exhaust line. Particles tend to build up in these 'blind-spots' while the ISPM still detects and reports a low particle count. The build-up of particles in these blind spots may eventually contaminate wafers processed in the chamber. FIG. 1 show the cross-section of a typical annealing chamber 10 having an upper housing 12 containing an array of quartz/halogen lamps 14 in a reflector unit 15 and a lower body 16, isolated from the upper body by a seal 17. The lower body 16 houses a rotatable support ring 18 having an opening with a recess onto which a wafer 20 is placed for processing. In use annealing gases are flowed through the chamber through the gas ports 25. The chamber 10 may also be fitted with a vacuum port (not shown). The support ring 18 is typically formed of silicon carbide and is supported on a fused quartz cylinder 22. In use, the support ring is rotated at a slow speed by a motor (not shown). Particulates, generated by the drive mechanism, in particular by the action of the bearings, build up in the regions 24 between the support ring and the lower body and can, in time, migrate onto the wafer's backside causing contamination thereon. Left in place, these particulates can migrate onto the wafers top side causing yield losses. Yield losses can occur not only in the chamber wherein the particles are initially deposited but, by transfer of the contaminated wafer to subsequent processing tools. Both the subsequent tools and the wafers processed therein can become contaminated. Migration of wafer backside contamination to device areas can occur as a result during subsequent processing or during physical examination of wafer backside. The regions 24 are considered as 'blind spots' because they cannot be observed by conventional optical sensors such as ISPMs. Blind spots occur in most wafer processing chambers.

The annealing chamber shown in FIG. 1 is used here primarily to illustrate regions in a typical processing chamber where particulates accumulate and which are not easily observable in real time using the traditional optical means. Other chamber types which have mechanical devices which operate during processing, in particular wafer rotation mechanisms, may include CVD (chemical vapor deposition) chambers, RIE (reactive ion etching) and plasma etching chambers, ion implant chambers, and PVD (physical vapor deposition) chambers (evaporators). Controlling particle contamination on the backside of a wafer by early detection is important to effective yield management.

Wafer backside contamination can also cause yield problems associated with lithographic depth of focus. If the wafer, more specifically the wafer's exposure field, cannot be maintained in a fully planar position during lithography exposure due to wafer backside contamination, the lithography tool cannot expose the entire wafer uniformly causing wafer to be scrapped. Therefore, it would be advantageous to have a method and apparatus for real-time monitoring of particle contamination in a wafer processing chamber that will take into account the presence of particle build up in 'blind-spots' of the chamber and thereby providing an early signal of the onset of backside contamination problems before expensive yield losses occur.

Hiatt, et. al., U.S. Pat. No. 5,963,315 discloses a method for measuring and monitoring backside contamination on semiconductor wafers while the wafer is still in the processing tool. The wafer is removed from the chuck, which secures it during processing, by a robotic arm. The arm then positions the wafer over a laser-detector arrangement and the exposed backside is scanned for particulate contamination. At completion of the scan, the robotic arm transports the wafer to the next location which may be into another processing chamber or into a load-lock for removal from the processing tool. Aqui, et. al., U.S. Pat. No. U.S. 5,347,138, provide real-time particle monitoring in a processing tool by passing a externally focused laser beam through a shielded plasma to an external detector, using windows in the tool. Moriya, et. al., U.S. Pat. No. 6,115,120, Ashan, et. al., U.S. Pat. No. 5,481,357, Bonin, et. al., U.S. Pat. No. 5,943,130, and Harwell, et. al., U.S. Pat. No. 6,032,544 teach similar procedures wherein external optical beams are focused and pass through flowing gases within a process chambers. Optical sensors then determine particulate intensity by measuring the light scattering caused by the particulates in the beam. Baier, U.S. Patent Application Publication No. 2004/0173310 A1 detects and monitors sidewall flaking in a plasma chamber by measuring the intensity of light scattered by polymer film materials deposited on the wall surface of plasma chamber. Chanayem, U.S. Pat. No. 5,271,264 discloses a method of in-situ particle monitoring in a plasma etching chamber by positioning an ISPM downstream of the chambers vacuum pump.

Koury, et al., U.S. Pat. No. 5,814,733 discloses a method of using an accelerometer for real time monitoring of vibrations in a wafer probe tester produced by various mechanical components such as fans and motors, which cause probe contact errors and otherwise produce inconsistent and erroneous electrical test results.

Although the final objective of the cited prior art is similar, all of the cited methods are limited to detecting particulates in regions of the processing tool which an optical beam/sensor arrangement can observe in real time. None of the optical methods are capable of real time monitoring of particle build up in the so-called 'blind-spot' regions of a processing chamber which cannot be practically fitted with optical detection equipment. It would therefore be desirable to have a non-optical method and apparatus for real-time monitoring of particle contamination buildup in a wafer processing chamber. The method and apparatus taught by the present invention not only accomplishes this goal but is also simpler, cost effective, and easier to implement than the optical methods and is capable of sensing and reporting conditions in blind spot regions.

SUMMARY OF THE INVENTION

It is an object of this invention to provide a design of an apparatus that provides real time measurement and monitoring of particulate contamination in a wafer processing chamber.

It is another object of this invention to provide a design of an apparatus that provides a measure the vibration amplitude of a physical component of a wafer processing chamber.

It is yet another object of this invention to describe a design of an apparatus that provides a timely signal of particulate contamination buildup in a wafer processing chamber which anticipates the onset of a predetermined particulate contamination level by a safety margin to permit pre-emptive maintenance of the chamber.

These objects are accomplished by securing an accelerometer, preferably a tri-axial accelerometer to a structural body of the process chamber wherein said structural body is a component of the process chamber onto which particulate contamination accumulates during wafer processing. The structural body described in the embodiments of this invention is a chamber platform which comprises or supports the wafer chuck mechanism, the latter being the chamber component on which the wafer is secured during processing. The wafer backside is thereby in direct contact with or is at least exposed to the structural body to which the accelerometer is fastened.

The accelerometer is supported by signal processing equipment which, during wafer processing, receives signals from the accelerometer. The signals are passed through an analog-to-digital converter and processed by a digital signal processor (DSP) to provide a vibration frequency signature of the chamber platform.

It is an object of this invention to provide a method for use of an apparatus that provides real time measurement and monitoring of particulate contamination in a wafer processing chamber.

This object is accomplished by providing an apparatus that provides real time measurement and monitoring of particulate contamination in a wafer processing chamber, said apparatus having an accelerometer, preferably a tri-axial accelerometer secured to a chamber platform which comprises or supports the wafer chuck mechanism of the process chamber. The accelerometer is supported by signal processing equipment which, during processing of a wafer receives signals from the accelerometer. The apparatus is calibrated using a test wafer which is initially cleaned and scanned for particle count using conventional optical scanning equipment. The signals are passed through an analog-to-digital converter and processed by a digital signal processor to provide a vibration frequency signature of the chamber platform. A frequency band of the signature is then selected as a monitor wherein an alarm and a pre-alarm amplitude are further selected to provide the pre-emptive notification for preventative maintenance and a second or final warning. The chamber is then used to process wafers in the normal fashion and the test wafer is run at various times in order to establish a calibration relating the selected vibration amplitudes to a particle count on the test wafer. Once this has been established, test wafers need only be processed occasionally in order to verify the calibration.

DESCRIPTION OF THE PREFERRED EMBODIMENT

Figure 2A:
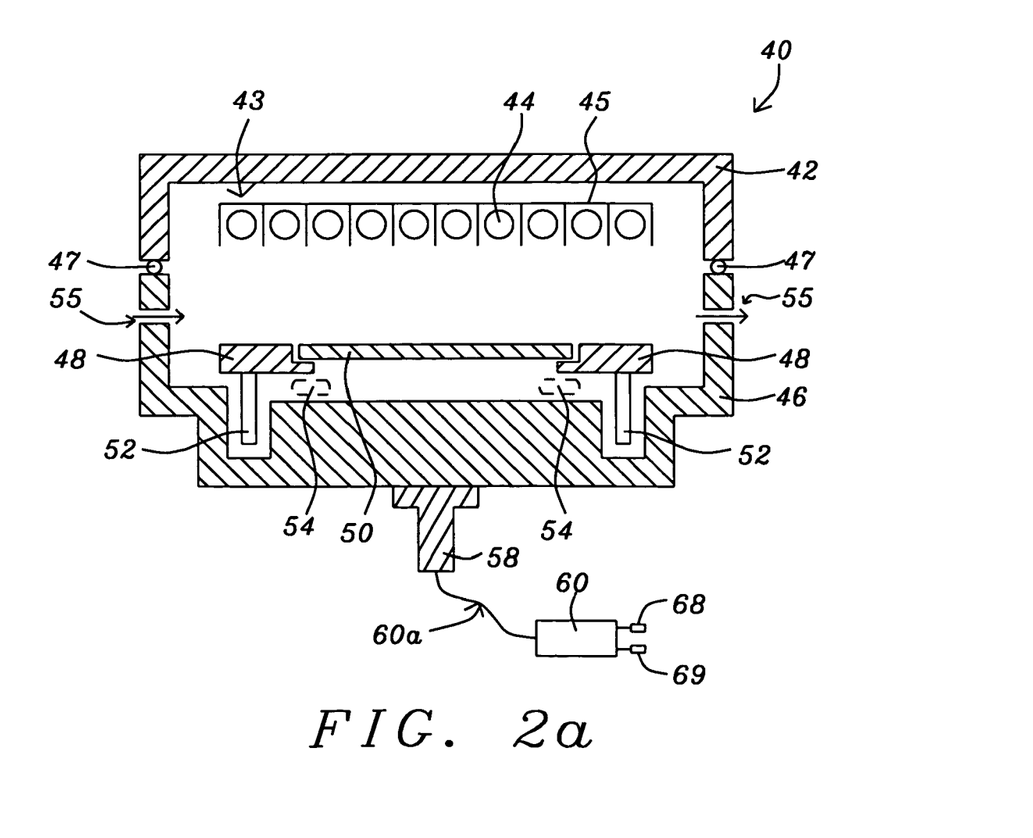
FIGS. 2*a* and 2*b* are cross sections of the processing chamber of FIG. 1 showing an accelerometer fastened to the lower body of the chamber according to an embodiment of this invention.
Figure 2B:
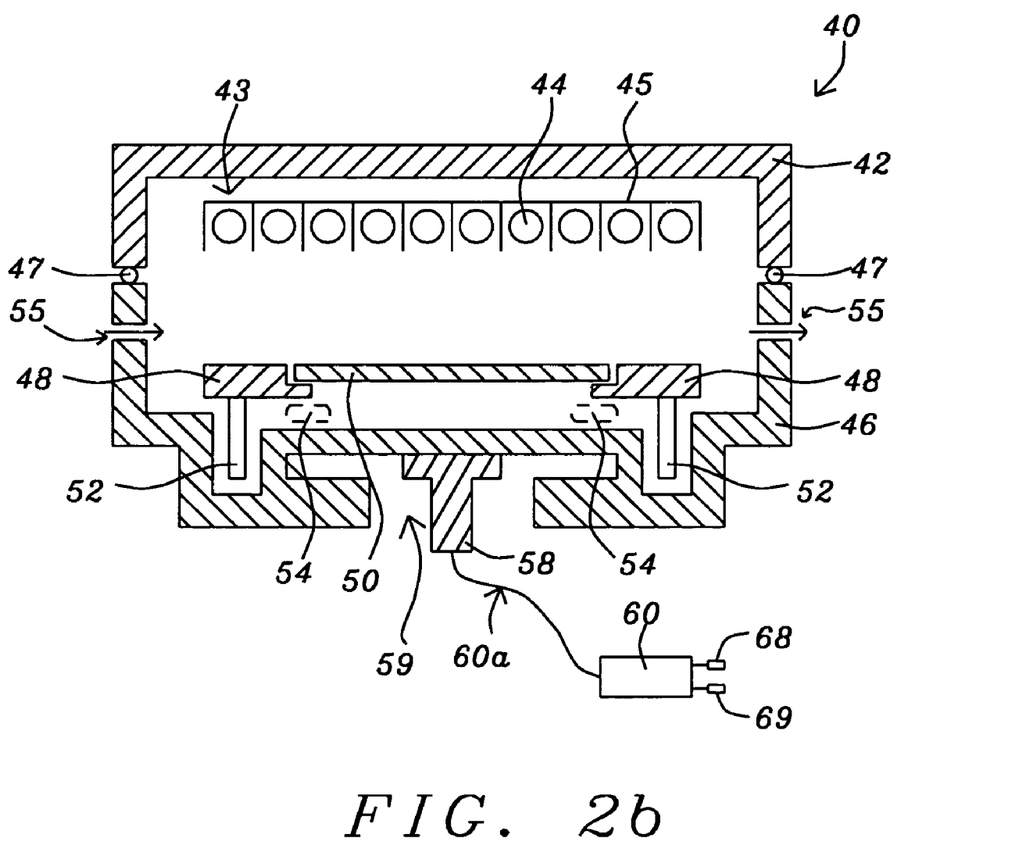

In an embodiment of this invention an annealing chamber for the processing of semiconductor wafers is provided. Referring to FIG. 2*a*, the annealing chamber 40 comprises a lower body 46 which houses a rotatable support ring 48 having a central opening with a circumferential recess 49 onto which a wafer 50 may be supported for processing. The annealing chamber further comprises an upper housing which covers and encloses the support ring 48 by engaging the lower body 46 with a circumferential seal 47. The upper housing 42 contains an array 43 of quartz/halogen lamps 44 in a reflector unit 45. The array 43 is of sufficient size to provide uniform heating of the wafer 50. In use annealing gases are flowed through the sealed chamber 40 through the gas ports 55. The chamber 40 may also be fitted with a vacuum port (not shown). The support ring 48 is preferably formed of silicon carbide and is supported on a cylinder 22, preferably of fused quartz. The cylinder 22 is supported by bearings (not shown) and is rotated during processing by a drive motor (not shown). An accelerometer 58 is solidly fastened to the lower body 46, preferably in a central location concentric with the support ring 48. In use, particles build up in the regions 54 between the support ring 48 and the lower body 46 and can in time migrate onto the wafer's backside causing particle contamination thereon. The accelerometer 58 may be affixed to any part of the lower body 46 as illustrated in FIG. 2*a*. However, sensitivity can be improved by reducing the mass of the lower body 46 between the accelerometer 58 and the regions 54 of particulate accumulation, for example, by providing a recessed opening 59 for the accelerometer as illustrated in FIG. 2*b*.

A suitable accelerometer is, for example, the Model 356B18 tri-axial accelerometer manufactured by PCB Piezotronics, Inc. 3425 Walden Avenue Depew, N.Y. A cable 60*a* connects the accelerometer 58 to a support and signal processing system 60 which is illustrated in a block diagram shown in FIG. 3. Vibrations are induced in the lower body 46, by the drive motor supra, bearings used by the drive mechanism, nearby devices such as cooling fans, pump motors, and building vibrations, or any other ambient vibration sources which can induce vibrational resonance in the body to which the accelerometer is fastened. In the present embodiment it was determined that the primary source of particles in the annealing chamber 40 was from the bearings used to couple the drive motor to the fused quartz cylinder 52.

Figure 3:
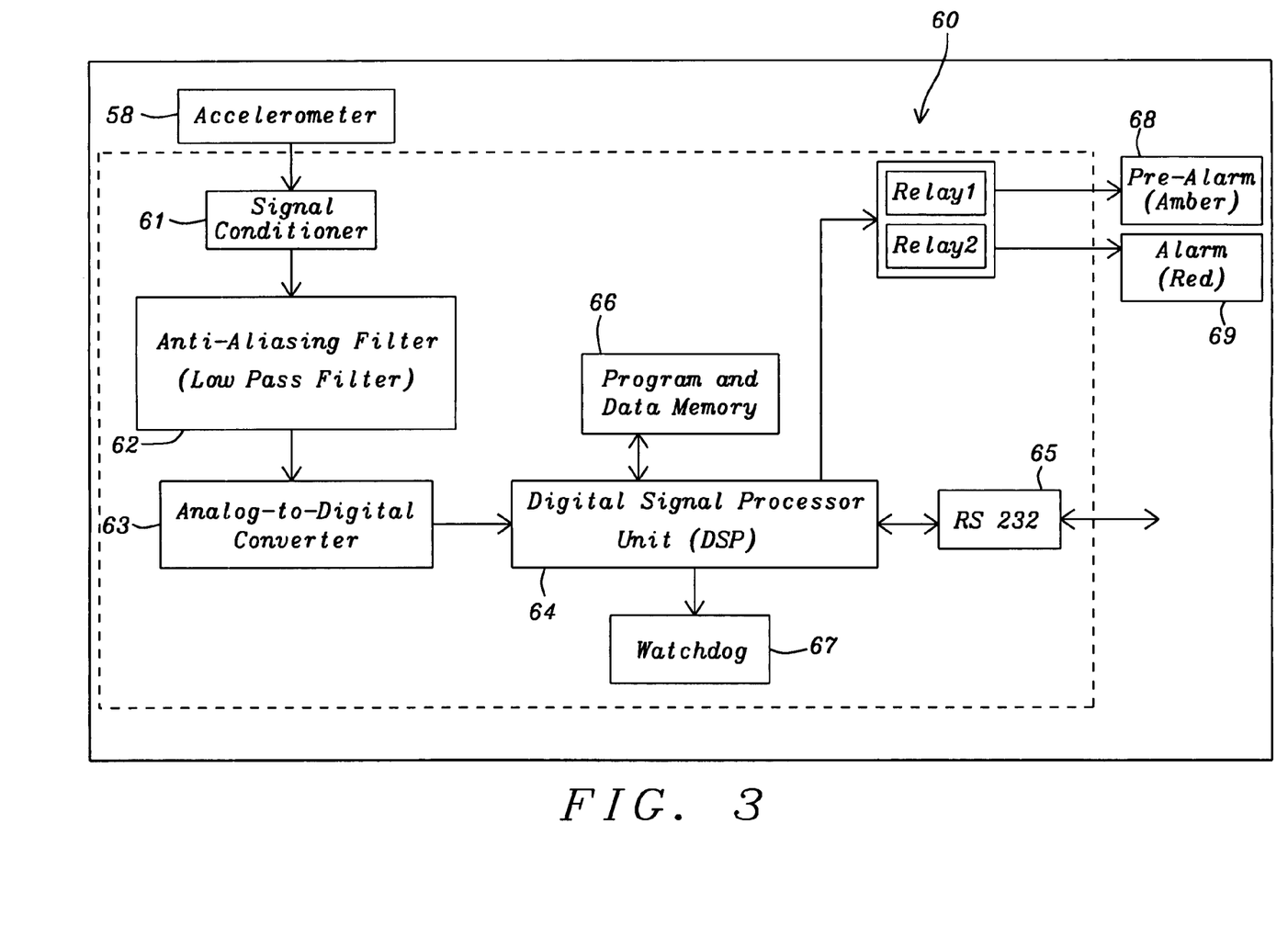
FIG. 3 is a block diagram showing the electronic circuitry used to process and utilize the signals provided by the accelerometer illustrated in FIG. 2*a* or 2*b* during the operation of a wafer processing chamber according to an embodiment of this invention.

Referring to FIG. 3, analog signals from the accelerometer 58 are produced by internal circuitry according to the respective restoring currents required to counteract mechanical displacements in the instrument. The signal conditioner 61 provides power to the accelerometer 58 which requires CCLD (constant current line drive) and signal amplification (optional). The unit 61 can be a stand alone unit or alternately, integrated into an anti-aliasing (low pass) filter 62. The analog signals are passed through the anti-aliasing filter 62 to an A/D (analog-to-digital) converter 63 to produce a digital signal which is then processed by the DSP unit 64 according to an analysis program which is downloaded to the DSP unit 64 from an external computer (not shown) through an RS 232 port 65 and stored in a local memory unit 66. The frequency bandwidth and cut-off frequency in the anti-aliasing filter can be controlled by the DSP unit 64. Alternately, a digital anti-aliasing filter may be used in conjunction with the DSP unit 64 instead of the analog low pass filter 62 thereby avoiding noise and drift problems inherent to analog filters. This will involve multi-rate processing by over sampling the signal and will require different setup and signal processing techniques. A watch-dog timer 67 is provided to assure protocol reliability and provide re-set capability of the DSP.

Figure 4:
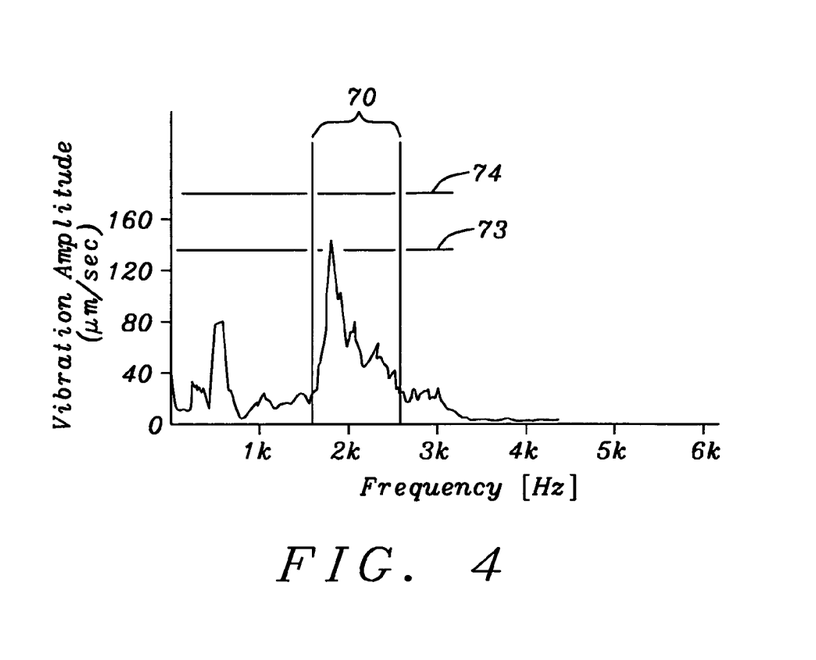
FIG. 4 is a chart showing the vibration amplitude signature of a body in a process chamber derived from the signals produced by an accelerometer affixed to it during wafer processing within the chamber according to an embodiment of this invention.

The analysis program converts the digital data from a time domain to a frequency domain by using a FFT (Fast Fourier Transform) algorithm. The resulting vibration amplitude is expressed as a velocity which is plotted as a function of frequency to establish a vibration amplitude signature for the lower body 46 of the processing chamber 40. A typical vibration signature of the lower body 46 of the annealing chamber used in the present invention is shown in FIG. 4. It was found that, in the annealing chamber of the present embodiment, the vibration peaks in the frequency bandwidth of 1.5 to 2.5 kHz. 70 were caused by the bearings in the wafer rotating drive mechanism. It was further noted that the amplitude of the peaks in this bandwidth was directly proportional to the buildup of particulates in the blind spot regions 24.

Figure 5:
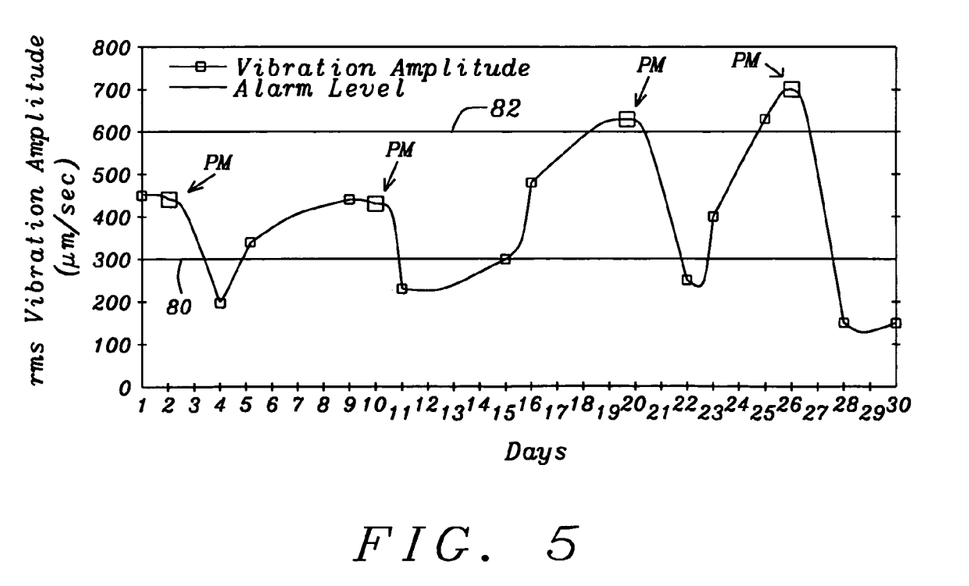
FIG. 5 is a chart showing the behavior of the vibration amplitude of a body in an annealing chamber monitored over a 30 day period during which the chamber received multiple cleanings.

Using the rms (root-mean-square) value of the amplitude of the peaks within the selected bandwidth 70 measured at between 1 and 4 day intervals, an annealing chamber was monitored over a thirty day period of routine usage in a manufacturing line. During the 30 day period, the chamber received four routine PM (Preventative Maintenance) cleanings which involved a thorough wet cleaning of the chamber and its components. The results are shown in FIG. 5. Clearly, regular monitoring the rms value of vibration amplitude in the selected frequency range provides good tracking of the chambers cleanliness. Based on these data, a pre-alarm level (amber) 80 of 300 μm/sec (rms) was chosen to signal the onset of particle build-up.

The choice of the alarm level (red) depends strongly on the particle tolerance of the product being processed in the chamber. Most of the product used today has very little tolerance. While PM returns the chamber to a safe level below the pre-alarm level 80, the alarm (red) level, which demands immediate PM, might occur at a level 82 of 600 μm/sec (rms) for a particular product. Another product may be more or less tolerant. It thus becomes clear that the efficiency of the process chamber can be greatly improved and the frequency of PM can be reduced by optimally sequencing the product mix. The ability to provide real time monitoring of particulate build-up in discrete regions of the process chamber permits the selection of two or more alarm levels which can provide a timely prediction, depending on the product schedule, of when the chamber must be shut down and cleaned.

In the process history illustrated by the time chart of FIG. 5, while the vibration amplitude was permitted to exceed the pre-alarm level 80 several times before PM was applied over the 30 day period, the PM always restored the tool to vibration amplitude below the 300 μm/sec. (rms) alarm level. A vibration amplitude below the pre-alarm level 80 after a PM is indicated by the extinguishing of the amber alarm. This signal would then immediately verify a successful PM with regard to particulates on the body 46. This early warning provides a valuable tool for job planners and greatly improves the efficiency of the production line operation. A second pre-alarm level could be added. The method and apparatus described by this invention incorporates two or more alarm levels chosen on the basis of optimum line efficiency and product tolerance. Referring to FIG. 4, in the example of the embodiment, a first pre-alarm level 73 is chosen at a vibration amplitude of 130 μm/sec (rms). A second 74 or critical alarm warning is set at 180 μm/sec (rms).

Referring back to FIG. 3, the output signal of the DSP unit can be monitored in real time and can be observed on an external computer through the RS-232 port 65. The DSP unit 64 is programmed to trigger alarms 68 and 69 which provide visible/audible warnings by activating relays 1 and 2 respectively when selected warning amplitude levels are reached. Further protective measures are also available to the monitoring system which, for example, will disable the load lock to the chamber, thereby preventing operation of the chamber until PM has been performed. The processed accelerometer signal can also be used to trigger other fail-safe procedures such as to signal catastrophic events.

Calibration of the accelerometer/signal processing unit with regard to actual particulate count is accomplished by the use of test wafers which are run in the tool 40 in place of product wafers. The backsides of cleaned test wafers are first scanned for particles, preferably using a conventional optical scanning tool, for example, the Surfscan SP1 dual laser inspection system manufactured by KLA/Tencor Corporation of San Jose, Calif. The test wafer is then loaded into the annealing chamber 40 and subjected to the normal processing recipe for that tool. After processing, the test wafer backside is scanned again and the particle count accumulated during the process run is determined. Tables I*a* and I*b* show the results of such a calibration procedure for two test wafers.

TABLE Ia

Test wafer #1 Particle Count

| Particle Size (μm.) | Before Alarm (cm$^{-2}$) | After Alarm (cm$^{-2}$) | Delta (cm$^{-2}$) |
|---|---|---|---|
| >0.16 | 0 | 1 | 1 |
| >0.2 | 0 | 3 | 3 |
| >0.3 | 1 | 4 | 3 |
| >1.0 | 0 | 0 | 0 |
| Total | 1 | 8 | 7 |

TABLE Ib

Test Wafer #2 Particle Count

| Particle Size (μm) | Before Alarm (cm$^{-2}$) | After Alarm (cm$^{-2}$) | Delta (cm$^{-2}$) |
|---|---|---|---|
| >0.16 | 0 | 2 | 2 |
| >0.2 | 1 | 2 | 1 |
| >0.3 | 1 | 3 | 2 |
| >1.0 | 0 | 1 | 1 |
| Total | 2 | 8 | 6 |

The experiment was performed when the chamber had already processed 1200 wafers and 2000 wafers for wafer #1 and #2 respectively while being monitored with the accelerometer. On wafer #1 there was 1 particle larger than 0.16 µm/cm² before the vibration alarm was triggered. This increased to 8 after the alarm. Similarly, on wafer #2, the particle count increased from 2 to 8 particles/cm² after the alarm. The results clearly indicate the timeliness of the warning alarm and the effectiveness of the method.

Figure 6:
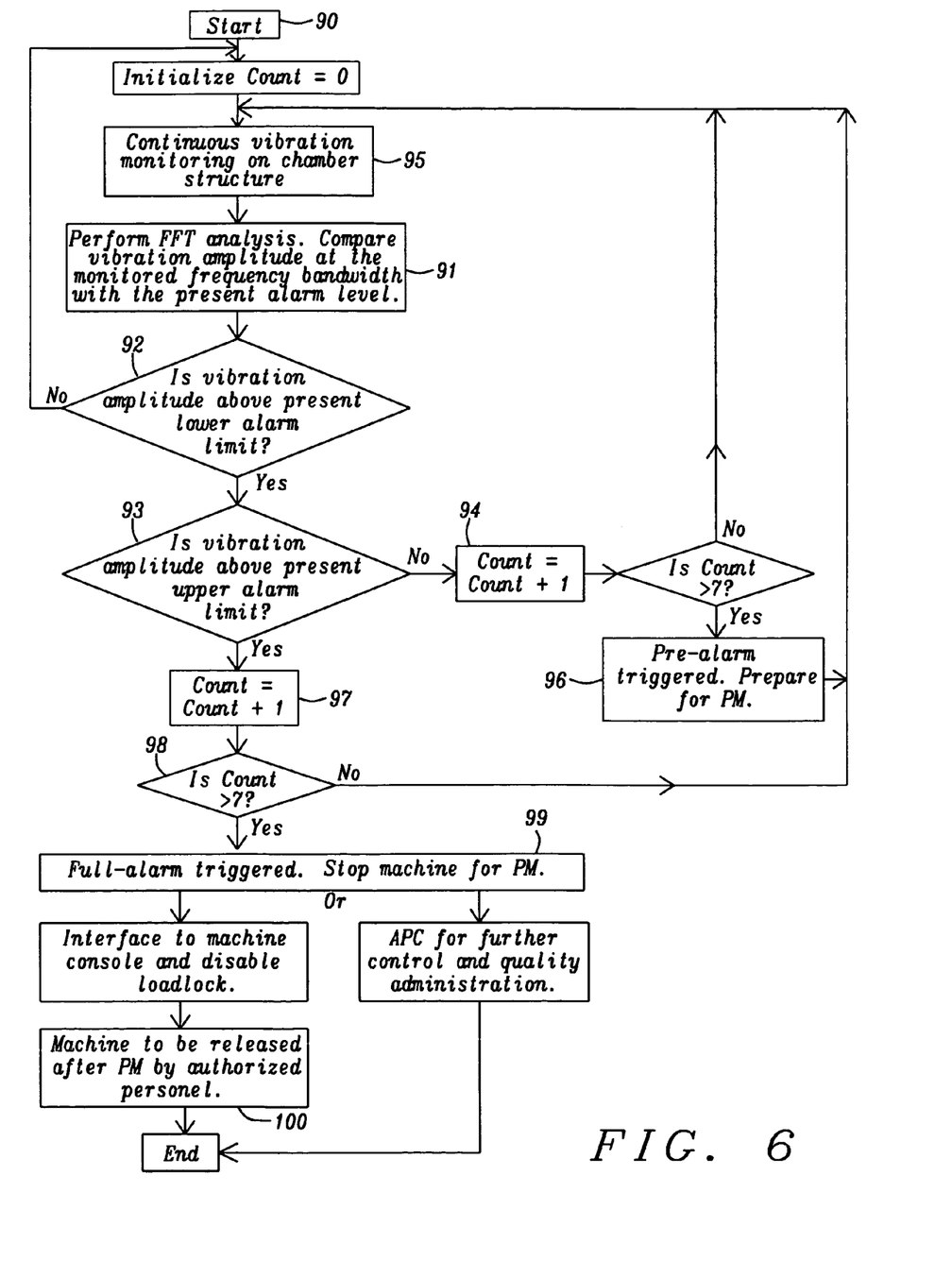
FIG. 6 is a flow chart showing the measurement steps exercised by the measurement circuitry during the real-time monitoring of particle contamination according to the process of this invention.

In FIG. 6 there is shown a flow chart of a method which can be applied to monitor and control particulate contamination in a wafer processing chamber using the equipment described by this invention. The processor is programmed to monitor the amplitude of the vibration signal in the frequency band 70 shown in FIG. 4 and perform actions when criteria in the flow diagram are met. The procedure is initialized by zeroing a counter 90. The amplitude signal is then processed by computing the FFT 91 and testing for meeting or exceeding a lower alarm preset point 92. A negative result directs the path to the beginning 90. The sampling time interval can be set according to a predetermined practical cycle time. Over time, as particle accumulation increases, the lower set point is reached 93 and the counter is advanced 94. Again the path returns to the beginning 95 but without resetting the counter and continues, re-testing in each cycle. Once a selected number of successive positive tests for the lower alarm limit are reached the alarm is triggered 96 and preparations for PM are initiated. The benefit of requiring a number of successive positive tests—seven in the present example—greatly reduces the chances of false alarms.

After the chamber is operated for a time, the upper alarm limit is reached and the test 93 passes to the final loop, advancing the counter 97 and recycling until the desired number of successive positive confirmations have occurred 98. Now the full alarm (red) is triggered 99 and the process tool is disabled at the completion of the job by the controller. After successful PM, the system is reset by the maintenance operators and released to continued use 100. Note that the set point for the red alarm should be set comfortably below the catastrophic danger point so that if the alarm triggers during a particular job, the job can be completed without fear of product loss.

The method and apparatus described by this invention has been shown to be reliable and accurate as well as cost effective and can be applied to any processing tool wherein a passive component of the tool, such as a support for a wafer holder or other structural member of the tool, gains mass during processing. While, in the embodiment of the present invention, an annealing tool is described, the teaching of the invention can also be applied to monitor particulate generation in deposition tools such as CVD or sputter deposition tools or to etching tools such as plasma etching or RIE tools and wherein said tools having mechanical components, such as wafer rotating devices which generate particulates during operation. In the case of etching or deposition tools, the effect of the etching or deposition environment on the body being monitored must be understood and accommodated, for example by providing appropriate shielding of the body or otherwise isolating the body from the etching or deposition environment. In the instance of the chamber configuration shown in FIGS. 2a and 2b, this could done by isolating and monitoring only that portion of the body to that falls below the wafer holder 48.

While this invention has been particularly shown and described with reference to the preferred embodiments thereof, it will be understood by those skilled in the art that various changes in form and details may be made without departing from the spirit and scope of the invention.

What is claimed is:

1. An apparatus for monitoring particulate build-up on a body enclosed in a chamber comprising:
   (a) a body, enclosed in a chamber, having at least one region whereon particles, generated by at least one particle source within said chamber may deposit during a processing operation;
   (b) an accelerometer securely fastened to said body and wherein said body is configured to minimize the mass thereof between said accelerometer and said at least one region;
   (c) a source of vibration to said body;
   (d) a signal conditioner connected to receive an analog signal from said accelerometer, pass said signal through an anti-aliasing filter, then through an analog-to-digital converter, to a programmable digital signal processing unit; and
   (e) at least one output device trigger-able by said digital signal processing unit.

2. The apparatus of claim 1 wherein said chamber is a wafer processing chamber.

3. The apparatus of claim 2 wherein said chamber is an annealing chamber, an etching chamber, or a deposition chamber.

4. The apparatus of claim 2 wherein said body is a support member of a wafer platform and said wafer platform is rotatably driven by a motor connected thereto by at least one bearing.

5. The apparatus of claim 1 wherein said digital signal processing unit is programmable by an external computer and thereby is capable of transforming said digital signal from a time domain signal to a frequency domain signal, analyzing a portion thereof to produce vibration amplitude.

6. The apparatus of claim 1 wherein said digital signal processing unit has means of triggering at least one of said at least one output device to post or sound an alarm when preset criteria are met.

7. The apparatus of claim 1 wherein said accelerometer is a tri-axial accelerometer.

8. A method for monitoring and signaling particle build-up in a processing chamber comprising:
   a) providing a processing chamber having;
      (i) a body enclosed therein;
      (ii) at least one source of particulates in said chamber, said particulates capable of depositing on at least one region of said body;
      (iii) an accelerometer securely fastened to said body and wherein said body is configured to minimize the mass thereof between said accelerometer and said at least one region;
      (iv) a least one source of vibration to said body;
      (v) a signal conditioner connected to receive an analog signal from said accelerometer, pass said signal through an anti-aliasing filter, then through an analog-to-digital converter, to;
      (vi) a programmable digital signal processing unit; and
      (vii) at least one output device trigger-able by said digital signal processing unit;
   b) operating said processing chamber whereby vibrations are induced in said body and particulates are deposited in at least one region thereon and whereby said accelerometer delivers an analog signal to said signal conditioner whereafter said signal is passed through said anti-aliasing filter and thereafter through said analog-to-digital converter which digitizes and delivers said signal to said digital signal processing unit wherein said signal is transformed from a time domain signal to a frequency domain signal, said signal processing unit further analyzing a portion thereof over a frequency band to produce a value of vibration amplitude; and c) said signal processing unit monitoring said value over time while continuously comparing said value to a preset value thereof, triggering an alarm when said value reaches or surpasses said preset value.

9. The method of claim 8 wherein said chamber is a wafer processing chamber.

10. The method of claim 9 wherein said body is a support member of a wafer platform.

11. The method of claim 10 wherein said wafer platform is rotatable by a motor coupled thereto with at least one bearing.

12. The method of claim 11 wherein one of said at least one source of particulates is said at least one bearing.

13. The method of claim 11 wherein one of said at least one source of vibration is said at least one bearing.

14. The method of claim 9 wherein said chamber is an annealing chamber, an etching chamber, or a deposition chamber.

15. The method of claim 8 wherein said accelerometer is a tri-axial accelerometer.

16. The method of claim 8 wherein said value of vibration amplitude is an rms (root-mean-square) value.

* * * * *